(12) United States Patent
Zhang et al.

(10) Patent No.: US 12,744,361 B2
(45) Date of Patent: Sep. 22, 2026

(54) LASER DIODE SYSTEM WITH LOW NUMERICAL APERTURE CLAD LIGHT STRIPPING

(71) Applicant: NLIGHT, INC., Camas, WA (US)

(72) Inventors: Jiamin Zhang, Camas, WA (US); Shuang Li, Camas, WA (US); Manoj Kanskar, Portland, OR (US)

(73) Assignee: NLIGHT, INC., Camas, WA (US)

( * ) Notice: Subject to any disclaimer, the term of this patent is extended or adjusted under 35 U.S.C. 154(b) by 836 days.

(21) Appl. No.: 17/761,466

(22) PCT Filed: Sep. 10, 2020

(86) PCT No.: PCT/US2020/050196
§ 371 (c)(1),
(2) Date: Mar. 17, 2022

(87) PCT Pub. No.: WO2021/055231
PCT Pub. Date: Mar. 25, 2021

(65) Prior Publication Data

US 2022/0352694 A1 Nov. 3, 2022

Related U.S. Application Data

(60) Provisional application No. 62/902,272, filed on Sep. 18, 2019.

(51) Int. Cl.
*H01S 5/40* (2006.01)
*G02B 6/42* (2006.01)
(Continued)

(52) U.S. Cl.
CPC ............ *H01S 5/4012* (2013.01); *G02B 6/421* (2013.01); *G02B 6/4296* (2013.01); *H01S 5/02251* (2021.01); *H01S 5/147* (2013.01)

(58) Field of Classification Search
CPC .................................................. H01S 5/02251
See application file for complete search history.

(56) References Cited

U.S. PATENT DOCUMENTS 7,400,795 B2 7/2008 Raszka et al.
10,267,993 B2 4/2019 Kliner
(Continued)

FOREIGN PATENT DOCUMENTS

GB 1036641 A 7/1966
JP 2007072418 A 3/2007
(Continued)

OTHER PUBLICATIONS

European Patent Office; International Search Report and Written Opinion PCT/US2020/050196 dated Dec. 3, 2020; 7 Pages.
(Continued)

*Primary Examiner* — Minsun O Harvey
(74) *Attorney, Agent, or Firm* — Wiley Rein LLP

(57) ABSTRACT

Some embodiments may include a packaged laser diode assembly, comprising: a length of optical fiber having a core and a cladding layer, the length of optical fiber having a first section and a second section, the first section of the length of optical fiber including a tip of an input end of the optical fiber; one or more laser diodes to generate laser light; one or more optical components to direct a beam derived from the laser light into the input end of the length of optical fiber; a clad light stripper on the second section of the length of optical fiber; wherein, in the first section of the length of optical fiber, the cladding layer includes: a light scattering feature at the tip of the input end of the optical fiber and/or a void along a length of the optical fiber.

16 Claims, 3 Drawing Sheets

(51) Int. Cl.

| | |
|---|---|
| ***H01S 5/02251*** | (2021.01) |
| ***H01S 5/14*** | (2006.01) |

(56) References Cited

U.S. PATENT DOCUMENTS

| | | | | |
|---|---|---|---|---|
| 2012/0262938 | A1* | 10/2012 | Price | G02B 6/262 362/553 |
| 2014/0205236 | A1 | 7/2014 | Noguchi et al. | |
| 2014/0211818 | A1* | 7/2014 | Hou | H01S 3/06729 372/6 |
| 2017/0110845 | A1* | 4/2017 | Hou | B23K 26/0622 |
| 2017/0371097 | A1 | 12/2017 | Wu et al. | |
| 2018/0278008 | A1 | 9/2018 | Hemenway et al. | |
| 2019/0094458 | A1* | 3/2019 | Ohara | A61B 1/0653 |
| 2021/0265801 | A1* | 8/2021 | Muendel | H01S 3/094007 |
| 2021/0373256 | A1* | 12/2021 | Hayamizu | G02B 6/266 |
| 2022/0344890 | A1 | 10/2022 | Li et al. | |

FOREIGN PATENT DOCUMENTS

| | | | |
|---|---|---|---|
| JP | 2018124428 | A | 8/2018 |
| WO | 1989/011743 | A1 | 11/1989 |
| WO | 2002/013339 | A1 | 2/2002 |
| WO | 2012/088267 | A2 | 6/2012 |
| WO | 2019/079532 | A1 | 4/2019 |

OTHER PUBLICATIONS

Federal Institute of Industrial Property; International Search Report and Written Opinion PCT/US2020/051116 dated Dec. 3, 2020; 7 Pages.

Federal Institute of Industrial Property; International Preliminary Report on Patentability PCT/US2020/051116 dated Apr. 14, 2022; 6 Pages.

* cited by examiner

LASER DIODE SYSTEM WITH LOW NUMERICAL APERTURE CLAD LIGHT STRIPPING

RELATED APPLICATIONS

The present application is a National Phase entry under 35 U.S.C. § 371 of International Application No. PCT/US2020/050196, filed on Sep. 10, 2020, which claims priority to U.S. Provisional Application No. 62/902,272, filed on Sep. 18, 2019, the entire contents of these applications are incorporated herein by reference in their entirety.

TECHNICAL FIELD

The present disclosure relates to laser diodes.

BACKGROUND

Fiber lasers are widely used in industrial processes (e.g., cutting, welding, cladding, heat treatment, etc.) In some fiber lasers, the optical gain medium includes one or more active optical fibers with cores doped with rare-earth element(s). The rare-earth element(s) may be optically excited ("pumped") with light from one or more semiconductor laser sources.

High brightness diode pump lasers have led to advances in high power fiber laser development. In order to achieve a high brightness feature with diode laser package designs, the design room for coupling spot and launch numerical aperture (NA) may be very tight with pigtail fiber. Some designs may couple light into the fiber cladding. Effective stripping of the coupled cladding light may be required for operational reliability and/or reduced thermal load of high power diode laser packages.

BRIEF DRAWINGS DESCRIPTION

The accompanying drawings, wherein like reference numerals represent like elements, are incorporated in and constitute a part of this specification and, together with the description, explain the advantages and principles of the presently disclosed technology.

DETAILED DESCRIPTION

Figure 1:
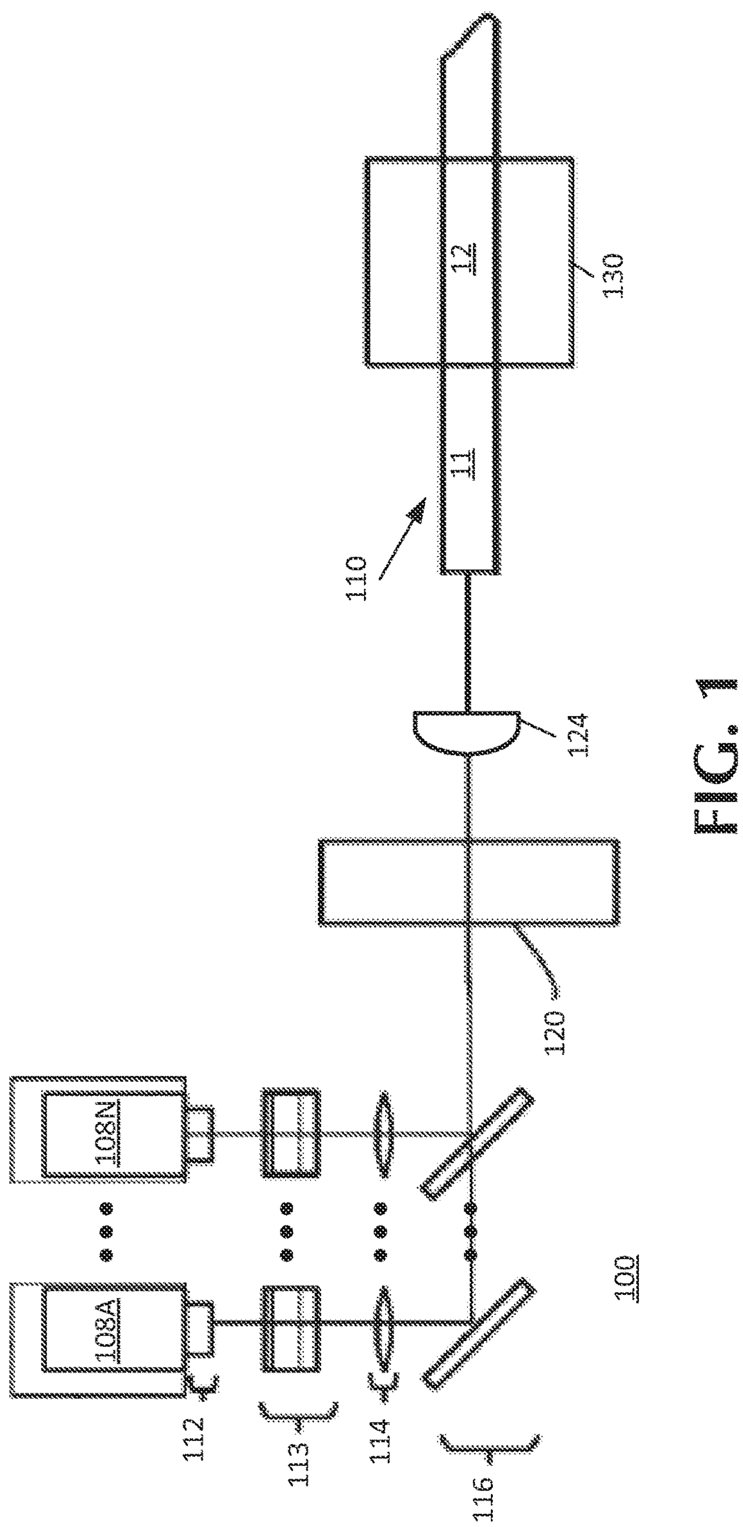
FIG. 1 illustrates a packaged laser diode assembly with low numerical aperture (NA) clad light stripping, according to various embodiments.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items. The systems, apparatus, and methods described herein should not be construed as limiting in any way. Instead, the present disclosure is directed toward all novel and non-obvious features and aspects of the various disclosed embodiments, alone and in various combinations and sub-combinations with one another. The term "or" refers to "and/or," not "exclusive or" (unless specifically indicated).

The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation. Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus.

Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art. In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

Some cladding light, especially with a low NA launch condition, is hard to strip off even by using a cladding light stripper. It is this type of cladding light that may cause fiber burn (e.g., in a single clad fiber) or increased thermal load on pump combiners (e.g., in a double clad fiber).

There are a number of ways for stripping out high NA cladding light, but the low NA cladding light may be hard to be stripped off. The difficulty of low NA cladding light stripping comes from the feature of nearly straight light propagation (e.g., parallel to an axis of the core of the optical fiber), that is, nearly no light propagates through an outer surface of the cladding. The low NA cladding light could propagate through a cladding light stripper without losing any power. When this cladding light reaches a fiber coating section in a single clad fiber case, the cladding light may enter a fiber polymer coating layer and could cause fiber burn. If a double cladding fiber is used for a diode package, this cladding light may lead to either fiber burn on a pump combiner input fiber or increased thermal load on a pump combiner package.

Some designs may include a fiber bend and/or apply localized stress to the fiber to increase stripping efficiency on low NA cladding light. However, these approaches may not be suitable for some laser diode packages due to space constraints.

Some embodiments described herein may reduce low NA light entering a fiber cladding layer and/or increase the propagation angle of the low NA cladding light in the cladding layer, thus enhancing stripping efficiency of a cladding light stripper. One embodiment may utilize a chamfered cladding surface on a coupling fiber tip, which may decrease coupling power into the cladding layer due to increase incident angle on the surface. The chamfered cladding surface may lead to increased propagation angle for low NA light inside the cladding layer. Other embodiments may include applying a high reflectivity coating to cladding surface of the coupling fiber tip and/or roughening up of the cladding surface of the coupling fiber tip.

In addition to (or instead of) chamfering, HR coating, roughening, or the like, or combinations thereof applied to the cladding layer at the tip, some embodiments may have a portion of the cladding layer scribed off just after the fiber tip, which may cause coupled cladding light to be efficiently scattered out. Residual cladding light may have a large propagation angle, allowing low NA cladding light to be efficiently stripped by a cladding light stripper.

FIG. 1 illustrates a packaged laser diode assembly 100 with low numerical aperture (NA) clad light stripping, according to various embodiments. The packaged laser diode assembly 100 may include an optical fiber 110 with a core surrounded by a cladding layer. A cladding light stripper 130 may be attached to a length of the optical fiber 110. A cladding layer of the optical fiber 110 may be arranged to reduce light (e.g., low NA light) entering the cladding layer in the first section 11 and/or to increase the propagation angle of light (e.g., low NA light) that does enter the cladding layer in the first section 11 (light having an increased propagation angle may be removed in the second section 12 by the cladding light stripper 130).

The system 100 may also include one or more diode lasers 108A-N to generate one or more laser beams, respectively, and a set of optics between the one or more diode lasers 108A-N and a tip of the optical fiber 110. The one or more diode lasers 108A-N may be similar to any known laser diodes, such as high power laser diodes. The set of optics between the one or more diode lasers 108A-N and the tip of the optical fiber 110 may be in known optical components used in packaged laser diode assembly. The set of optics may process the laser beams emitted by the diode lasers 108A-N and direct the processed light into the tip of the optical fiber 110.

Reference is now made to an example in which the diode lasers 108A-N and the optics to process laser beams thereof are similar to any diode lasers and optics described in U.S. Patent Application 2017/0235057, which is incorporated by reference herein. The diode lasers 108A-N may be secured so as to be situated at different heights, typically so as to monotonically descend or ascend (a single one of the diode lasers 108A-N may be secured to each step and the diode lasers are secured to the steps so as to emit laser radiation along substantially parallel axes).

The emitted beams from the diode lasers 108A-N may be received and collimated by fast axis collimation optics 112 and slow axis collimation optics 114 to produce collimated beams. In some embodiments, volume Bragg grating elements 113 may be positioned between the fast axis collimation optics 112 and the slow axis collimation optics 114 to provide locking of the wavelength of the lasers diodes 108A-108N. Turning mirrors 116 may receive the collimated beams (which may propagate generally parallel to each other after collimation). In this example, the turning mirrors 116 are situated to reflect the collimated beams at right angles so that the reflected beams are directed to a combiner 120 (such as any beam compressor described in the '057 publication).

An output of the combined 120 (e.g., compressed beams) may be directed to a refocusing lens 124 that directs the output into the tip of the optical fiber 110. The refocusing lens 124 may be similar to any lens described in the '057 publication.

Figures 2, 3:
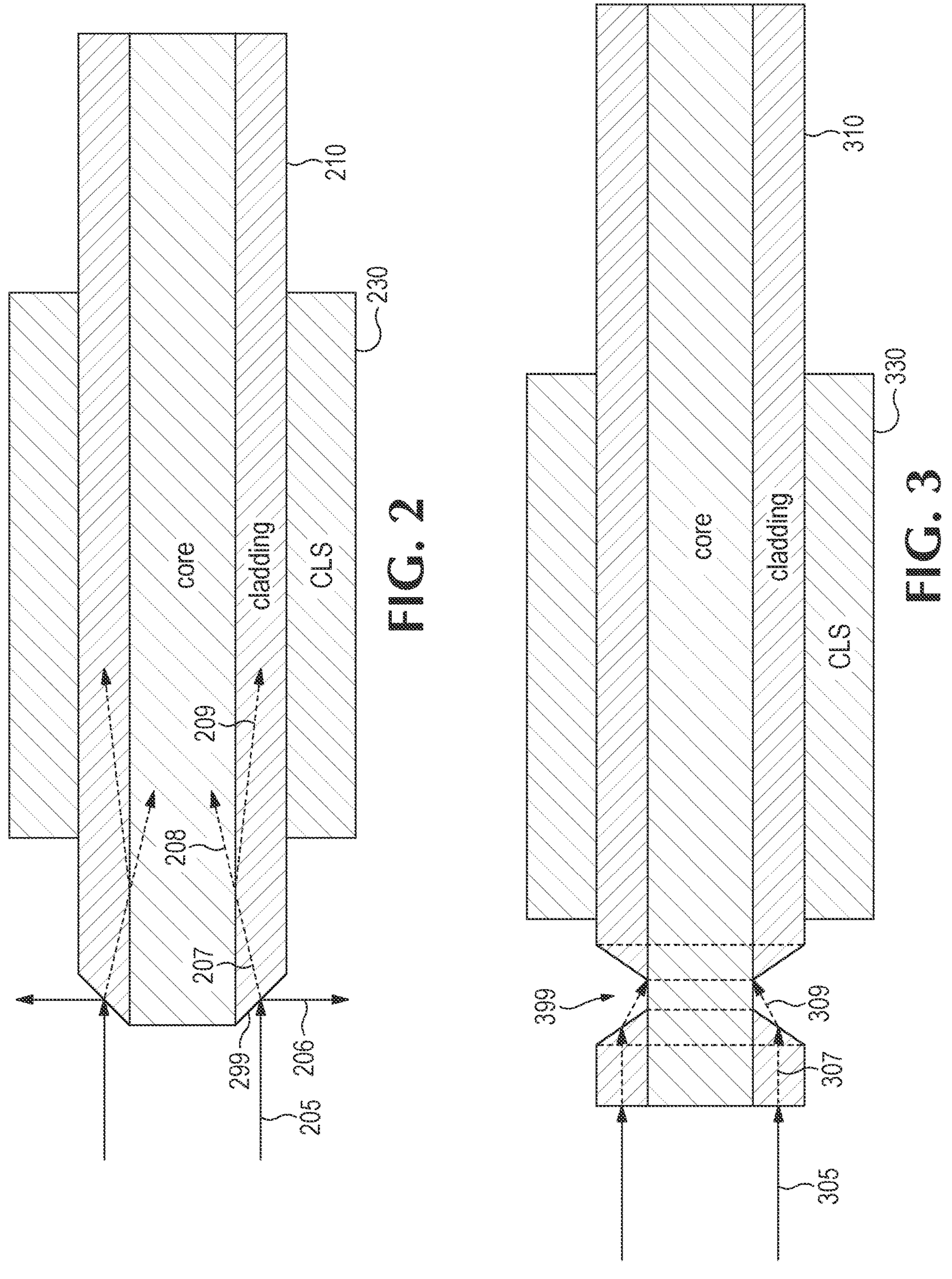
FIG. 2 illustrates a cross-sectional view of an optical fiber with a first section having a cladding layer with a chamfered surface at the optical fiber tip and a second section with a cladding light stripper thereon, according to various embodiments.
FIG. 3 illustrates a cross-sectional view of an optical fiber with a first section having a cladding layer with a void in the cladding layer along a length of the optical fiber and a second section with a cladding light stripper thereon, according to various embodiments.
Figures 4, 5:
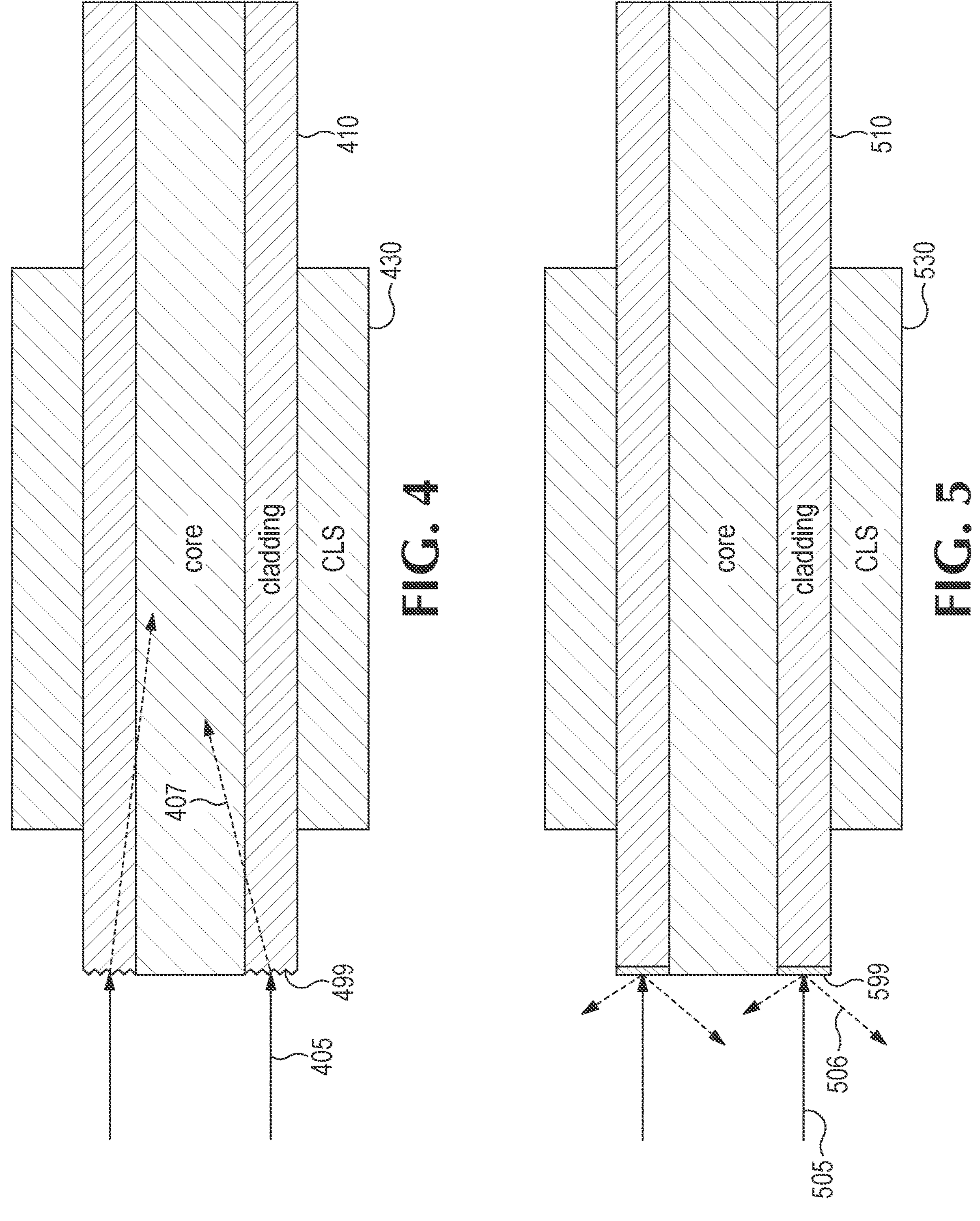
FIG. 4 illustrates a cross-sectional view of an optical fiber with a first section having a cladding layer with roughened surface at the optical fiber tip and a second section with a cladding light stripper thereon, according to various embodiments.
FIG. 5 illustrates a cross-sectional view of an optical fiber with a first section having a cladding layer with a high reflector (HR) coated surface at the optical fiber tip and a second section with a cladding light stripper thereon, according to various embodiments.

According to various embodiments, the cladding layer in the first section 11 may include a light scattering feature at the cladding surface on the tip of the optical fiber 110. The light scattering feature may be arranged to reduce light (e.g., low NA light) entering the cladding layer in the first section 11. In examples including the light scattering feature at the cladding surface on the tip of the optical fiber 110, the light scattering feature may be a sloped surface (a linear slope or a non-linear slope) on the cladding layer at the tip of the optical fiber (a cross-sectional view of an optical fiber having a chamfered surface is shown in FIG. 2). In other examples, the light scattering feature at the cladding surface on the tip of the optical fiber 110 may be a roughened surface (a cross-sectional of an optical fiber having this type of light scattering feature is shown in FIG. 4) or a high reflector (HR) coating (a cross-sectional of an optical fiber having this type of light scattering feature is shown in FIG. 4). Various embodiments may include more than one of these light scattering features in any combination (e.g., sloped, roughened and/or HR coated in any combination).

Referring again to FIG. 1, according to various embodiments, a length of the optical fiber 110 may include a void in a portion of the cladding layer (a cross-sectional of an optical fiber having a void in a portion of the cladding layer in the length of the optical fiber is shown in FIG. 3). The cladding surface in the void may include a light scattering feature, such as a slope or some other light scattering feature. This light scattering feature may increase the propagation angle of light (e.g., low NA light) that does enter the cladding layer in the first section 11. Low NA light having the increased propagation angle can be removed more efficiently by the cladding light stripper 130 than low NA light traveling at no angle (e.g., traveling parallel to an axis of the core).

Cladding light stripper 130 may be similar to any known cladding light stripper in any respect. However, due to the cladding layer arranged to reduce low NA light entering the cladding layer in the first section 11 and/or to increase the propagation angle of low NA light that does enter the cladding layer in the first section 11, in the packaged diode laser assembly 100 the cladding light stripper 130 may be shorter than some other cladding light strippers (due to the improved cladding layer in the first section 11). As a result, the overall dimensions of the packaged diode laser assembly 100 may be more compact than known packaged diode laser assemblies 100 of similar optical performance/power.

FIG. 2 illustrates a cross-sectional view of an optical fiber 210 with a first section having a cladding layer with a chamfered surface 299 at the optical fiber tip and a second section with a cladding light stripper 230 thereon, according to various embodiments. The optical fiber 210 may be used in any packaged laser diode assembly described herein (including the packaged laser diode assembly 100 of FIG. 1). In the illustrated embodiment, the chamfered surface 299 has a linear 45 degree slope—in other examples, a sloped surface of the cladding layer may have a slope that is linear (at a 45 degree angle or any other acute angle) or non-linear. In other examples, the "angled" surface may have any profile with one or more angled surfaces (e.g., multiple angled surfaces).

Optically-processed light 205 (e.g., from the refocusing lens 124 described with reference to FIG. 1) may be received at the chamfered surface 299 of the cladding layer. The chamfered surface 299 may reduce light (e.g., low NA light) entering the cladding layer by reflecting light 206 due to the slope. Also, the chamfered surface 299 may change the propagation angle of some of the light 205—light 207 has a propagation angle that is non-parallel with an axis of the core.

In contrast to light with a propagation angle parallel to the axis of the core, some of the light 207 with the propagation angle that is non-parallel with an axis of the core may be removed by the CLS 230. For instance, light 207 may reflect within the cladding layer causing reflected light 209 to reach an outer surface of the cladding (and thus stripped by the CLS 230). Other light with a non-parallel propagation light (e.g., light 208) may bounce around within the cladding layer and/or pass through the core and may be stripped by the CLS 230.

The chamfered surface 299 may be provided by laser processing the cladding layer at the tip of the optical fiber 210 (without changing the profile of the core at the tip). In other examples, it may be possible or practical to mechanically cut the cladding layer.

FIG. 3 illustrates a cross-sectional view of an optical fiber 310 with a first section having a cladding layer with a void 399 in the cladding layer along a length of the optical fiber and a second section with a cladding light stripper 330 thereon, according to various embodiments. The optical fiber 310 may be used in any packaged laser diode assembly described herein (including the packaged laser diode assembly 100 of FIG. 1).

In the illustrated example, the void 399 exposes the core, but some other voids may not necessarily expose the core depending on applications. In the illustrated example, the void 399 extends all the way around the optical fiber 310, but some other voids may not necessarily extend all the way around the optical fiber 310 depending on applications. In the illustrated example, both sidewalls of the void 399 have profiles similar to the chamfered surface (e.g., 45 degree angles), and are symmetrical, but symmetry is not required. In some examples it may be possible or practical to have any sloped surface (linear or non-linear) for at least one sidewall of the void 399 (or even at least one sidewall with an "angled" surface that have any profile with one or more angled surfaces (e.g., multiple angled surfaces)).

Optically-processed light 305 (e.g., from the refocusing lens 124 described with reference to FIG. 1) may be received at the cladding layer at the tip of the optical fiber 310. The light 307 that enters the first section of the optical fiber 310 may have a propagation angle that is parallel to an axis of the core, however, the sloped surface defining the void 399 may change the propagation angle of some of the light 307 to a propagation angle that is non-parallel with an axis of the core. The light 309 with the non-parallel propagation angle may be removed by the CLS 330.

A sloped sidewall of the void 399 may reduce light (e.g., low NA light) entering the cladding layer by reflecting light 309 due to the slope. In contrast to light with a propagation angle parallel to the axis of the core, some of the light 309 with the propagation angle that is non-parallel with an axis of the core may be removed by the CLS 330. For instance, light 309 may reflect within the cladding layer causing reflected light to be received by the CLS 330. Light 309 may bounce around within the cladding layer and/or pass through the core and may be stripped by the CLS 330.

The void 399 may be created by scribing off some of the cladding layer on a surface of a length of the optical fiber 310. This may be done using laser processing, or by a mechanical cut in other examples. The void 399 may be filled with air. In some examples, it may be possible and practical to use a void similar to void 399 in combination with the sloped surface described with reference to FIG. 2.

FIG. 4 illustrates a cross-sectional view of an optical fiber 410 with a first section having a cladding layer with roughened surface 499 at the optical fiber tip and a second section with a cladding light stripper 430 thereon, according to various embodiments. The optical fiber 410 may be used in any packaged laser diode assembly described herein (including the packaged laser diode assembly 100 of FIG. 1). In this example, the surface of the cladding layer at the tip of the optical fiber 410 has been roughened to provide a roughened surface 499.

Optically-processed light 405 (e.g., from the refocusing lens 124 described with reference to FIG. 1) may be received at the roughened surface 499 of the cladding layer. The roughened surface 499 may reduce light (e.g., low NA light) entering the cladding layer by reflecting light (not shown). Also, the roughened surface 499 may change the propagation angle of some of the light 405—light 407 has a propagation angle that is non-parallel with an axis of the core (and the light 407 may be removed by the CLS 430). Any known tools for roughening a surface may be used.

FIG. 5 illustrates a cross-sectional view of an optical fiber 510 with a first section having a cladding layer with a high reflector (HR) coated surface 599 at the optical fiber tip and a second section with a cladding light stripper 530 thereon, according to various embodiments. The optical fiber 510 may be used in any packaged laser diode assembly described herein (including the packaged laser diode assembly 100 of FIG. 1). In this example, the surface of the cladding layer at the tip of the optical fiber 510 has been coated with an HR coating to provide an HR coated surface 599.

Optically-processed light 505 (e.g., from the refocusing lens 124 described with reference to FIG. 1) may be received at the HR coated surface 599 of the cladding layer. The HR coated surface 599 may reduce light (e.g., low NA light) entering the cladding layer by reflecting light 506. Any known HR coating may be applied to the cladding layer at the tip of the optical fiber 510 to provide HR coated surface 599.

In some examples, it may be possible and practical to roughen the cladding layer at the tip of an optical fiber, and then HR coat the roughened surface. Also, in some examples it may be possible and practical to apply an HR coating on a sloped surface of the cladding layer at the tip of the input end of the optical fiber and/or apply an HR coating to one or more sidewalls of a void in the cladding layer along the length of the optical fiber.

In view of the many possible embodiments to which the principles of the disclosed technology may be applied, it should be recognized that the illustrated embodiments are only preferred examples and should not be taken as limiting the scope of the disclosure. We claim as our invention all that comes within the scope and spirit of the appended claims.

The invention claimed is:

1. A packaged laser diode assembly, comprising:

a length of optical fiber having a core and a cladding layer, the length of optical fiber having a first section and a second section, the first section of the length of optical fiber including a tip of an input end of the optical fiber;

one or more laser diodes to generate laser light;

means for directing a beam derived from the laser light into the input end of the length of optical fiber;

a cladding light stripper on the second section of the length of optical fiber; and wherein, in the first section of the length of optical fiber, the cladding layer includes: a void along a length of the optical fiber, wherein the void is positioned distally of the tip of the input end of the optical fiber and has at least one sloped sidewall that reflects light entering the cladding layer by reflecting light due to the slope, and wherein light entering the first section has a propagation angle parallel to the core and the at least one sloped surface of the void changes the propagation angle of some of the light to a propagation angle that is non-parallel with an axis of the core.

2. The packaged laser diode assembly according to claim 1, wherein, in the first section of the length of optical fiber, the cladding layer further includes a light scattering feature at the tip of the input end of the optical fiber.

3. The packaged laser diode assembly of claim 2, wherein the light scattering feature in the first section of the length of optical fiber at the tip of the input end of the optical fiber comprises a sloped surface.

4. The packaged laser diode assembly of claim 3, wherein the sloped surface has a linear slope.

5. The packaged laser diode assembly of claim 3, wherein the sloped surface is smooth.

6. The packaged laser diode assembly of claim 2, wherein the light scattering feature comprises a roughened surface.

7. The packaged laser diode assembly of claim 2, wherein the light scattering feature comprises an high reflection (HR) coating.

8. The packaged laser diode assembly of claim 1, wherein the void in the first section of the length of optical fiber along the length of the optical fiber exposes a portion of the core.

9. The packaged laser diode assembly of claim 1, wherein the void extends entirely around the core.

10. The packaged laser diode assembly of claim 1, wherein the at least one sidewall comprises a plurality of sidewalls.

11. The packaged laser diode assembly of claim 1, wherein the void is filled with air.

12. The packaged laser diode assembly of claim 1, wherein light with the non-parallel propagation angle is removed by the cladding light stripper.

13. A packaged laser diode assembly, comprising:

a length of optical fiber having a core and a cladding layer, the length of optical fiber having a first section and a second section, the first section of the length of optical fiber including a tip of an input end of the optical fiber;

one or more laser diodes to generate laser light;

means for directing a beam derived from the laser light into the input end of the length of optical fiber;

means for stripping light on the second section of the length of optical fiber; and means for scattering light in the first section of the length of optical fiber, wherein the light scattering means defines at least one side of a void along a length of the optical fiber, wherein the void is positioned distally of the tip of the input end of the optical fiber and has at least one sloped sidewall that reflects light entering the cladding layer by reflecting light due to the slope, and wherein light entering the first section has a propagation angle parallel to the core and the at least one sloped surface of the void changes the propagation angle of some of the light to a propagation angle that is non-parallel with an axis of the core.

14. The packaged laser diode assembly of claim 13, wherein the light scattering means further comprises a light scattering feature located at the tip of the input end of the optical fiber.

15. The packaged laser diode assembly of claim 13, wherein the void exposes a portion of the core.

16. The packaged laser diode assembly of claim 13, wherein the void extends entirely around the core.

* * * * *